(12) United States Patent
Murphy

(10) Patent No.: US 6,611,222 B1
(45) Date of Patent: Aug. 26, 2003

(54) LOW-COMPLEXITY HIGH-SPEED ANALOG-TO-DIGITAL CONVERTERS

(76) Inventor: Charles Douglas Murphy, 1726 N. Sedgwick Ave. #2R, Chicago, IL (US) 60614

(*) Notice: Subject to any disclaimer, the term of this patent is extended or adjusted under 35 U.S.C. 154(b) by 0 days.

(21) Appl. No.: 10/159,936

(22) Filed: Jun. 3, 2002

(51) Int. Cl.[7] .................................................. H03M 1/12

(52) U.S. Cl. ...................... 341/155; 341/145; 341/161; 341/156; 341/150; 341/120

(58) Field of Search ................................. 341/141, 145, 341/150, 155, 156, 161

(56) References Cited

U.S. PATENT DOCUMENTS

| | | |
|---|---|---|
| 4,124,844 A | 11/1978 | Black |
| 4,214,232 A | 7/1980 | Shaw et al. |
| 4,641,129 A | 2/1987 | Doluca et al. |
| 4,691,190 A | 9/1987 | Robinson |
| 4,763,107 A | 8/1988 | Koen et al. |
| 4,849,759 A | 7/1989 | Hughes |
| 4,855,745 A | 8/1989 | Smither |
| 4,875,048 A | 10/1989 | Shimizu et al. |
| 4,890,107 A | 12/1989 | Pearce |
| 4,894,657 A | 1/1990 | Hwang et al. |
| 4,942,399 A | 7/1990 | Buchholtz et al. |
| 4,994,806 A | 2/1991 | Lee |
| 4,994,808 A | 2/1991 | Wichelman |
| 5,010,338 A | 4/1991 | Miki et al. |
| 5,043,732 A | 8/1991 | Robertson et al. |
| 5,049,882 A | 9/1991 | Gorecki et al. |
| 5,086,299 A | 2/1992 | Frigerio et al. |
| 5,107,265 A | 4/1992 | Sloane |
| 5,148,162 A | 9/1992 | Crosby |
| 5,212,486 A | 5/1993 | Nagaraj |
| 5,225,837 A | 7/1993 | Hosotani et al. |
| 5,241,312 A | 8/1993 | Long |
| 5,274,377 A | 12/1993 | Matsuura et al. |
| 5,283,581 A | 2/1994 | Miki et al. |
| 5,283,583 A | 2/1994 | Ichihara |
| 5,436,629 A | 7/1995 | Mangelsdorf |
| 5,495,247 A | 2/1996 | Yamamoto et al. |

(List continued on next page.)

OTHER PUBLICATIONS

Paul Horowitz & Winfield Hill, The Art of Electronics, 1994, pp. 613, 614, and 621–641, $2^{nd}$ Ed, Cambridge University Press, New York.

Primary Examiner—Michael Tokar
Assistant Examiner—Lam Mai

(57) ABSTRACT

A machine used for multi-stage analog-to-digital (A/D) conversion accepts as a stage input an unknown analog input signal and produces as a stage output a residue signal which is negatively scaled with respect to the unknown analog input signal. Combination of the unknown analog input signal and adjustment signals and scaling are accomplished using a circuit requiring only a single op-amp and corresponding output settling delay. The negatively scaled residue signal is passed as input to the following stage. The effects of negative scaling are compensated for in the following stage with proper connection of desired pre-generated reference signals to the second stage's comparators. The invention has a much lower implementation cost than full flash A/D conversion, particularly for high-precision conversions. The invention is also faster than successive approximation (SA) A/D conversion. With proper design, the implementation cost of the present invention can be less than that of prior art SA A/D converters. Op-amp circuits which take up chip space, use power, and introduce conversion delay can be eliminated, as can some timing and switching circuitry. If timing and switching circuitry are included, the invention can be implemented with cyclic or with pipelined stages. Embodiments with multi-bit stages having higher stage cost but faster overall speed are possible, using techniques of partial flash conversion.

20 Claims, 5 Drawing Sheets

U.S. PATENT DOCUMENTS

| | | | |
|---|---|---|---|
| 5,499,028 A | 3/1996 | Kuwano et al. | |
| 5,534,864 A | 7/1996 | Ono et al. | |
| 5,563,599 A | 10/1996 | Stevens et al. | |
| 5,565,868 A | 10/1996 | Azrouf et al. | |
| 5,572,212 A | 11/1996 | Levinson et al. | |
| 5,677,692 A | 10/1997 | Hasegawa | |
| 5,684,480 A | 11/1997 | Jansson | |
| 5,696,511 A | 12/1997 | Matsumoto et al. | |
| 5,710,563 A | 1/1998 | Vu et al. | |
| 5,764,176 A | 6/1998 | Ginetti | |
| 5,771,012 A | 6/1998 | Shu et al. | |
| 5,835,047 A | 11/1998 | Vorenkamp et al. | |
| 5,861,832 A | 1/1999 | Nagaraj | |
| 5,867,116 A | 2/1999 | Nakamura et al. | |
| 5,877,720 A | 3/1999 | Setty et al. | |
| 5,966,088 A | 10/1999 | Matsumoto et al. | |
| 6,011,503 A | 1/2000 | Lee | |
| 6,031,480 A | 2/2000 | Soenen et al. | |
| 6,037,891 A | 3/2000 | Griph | |
| 6,100,834 A | 8/2000 | Lewyn | |
| 6,124,818 A | 9/2000 | Thomas et al. | |
| 6,127,958 A | 10/2000 | Chang et al. | |
| 6,157,338 A | 12/2000 | Gross, Jr. | |
| 6,177,899 B1 | 1/2001 | Hsu | |
| 6,181,268 B1 | 1/2001 | Miyake et al. | |
| 6,195,032 B1 | 2/2001 | Watson et al. | |
| 6,232,907 B1 | 5/2001 | Nagaraj et al. | |
| 6,259,393 B1 | 7/2001 | Ogawa et al. | |
| 6,281,828 B1 | 8/2001 | Kimura et al. | |
| 6,281,831 B1 | 8/2001 | Shou et al. | |
| 6,285,309 B1 | 9/2001 | Yu | |
| 6,288,663 B1 | 9/2001 | Hester et al. | |
| 6,304,204 B1 * | 10/2001 | Norman | 341/161 |
| 6,304,205 B1 | 10/2001 | Rezvani et al. | |
| 6,304,208 B1 | 10/2001 | Nagashima | |
| 6,323,800 B1 | 11/2001 | Chiang | |
| 6,326,914 B1 | 12/2001 | Sevenhans | |
| 6,333,709 B2 | 12/2001 | Miyamoto | |
| 6,337,651 B1 | 1/2002 | Chiang | |
| 6,340,942 B1 | 1/2002 | Zhou et al. | |
| 6,340,943 B1 | 1/2002 | Chow et al. | |
| 6,346,902 B1 | 2/2002 | Venes et al. | |
| 6,351,231 B1 | 2/2002 | Price et al. | |
| 6,366,230 B1 | 4/2002 | Zhang et al. | |
| 6,369,732 B1 | 4/2002 | Liu et al. | |
| 6,369,744 B1 | 4/2002 | Chuang | |
| 6,373,420 B1 | 4/2002 | Harada | |
| 6,486,807 B2 * | 11/2002 | Jonsson | 341/155 |
| 6,496,128 B2 * | 12/2002 | Wiesbauer et al. | 341/155 |

* cited by examiner

LOW-COMPLEXITY HIGH-SPEED ANALOG-TO-DIGITAL CONVERTERS

CROSS-REFERENCE TO RELATED APPLICATIONS

Not applicable

STATEMENT REGARDING FEDERALLY SPONSORED RESEARCH OR DEVELOPMENT

Not applicable

REFERENCE TO A MICROFICHE APPENDIX

Not applicable

BACKGROUND

1. Field of Invention

The invention relates to analog-to-digital (A/D) conversion, particularly to high-speed A/D conversion with reduced component cost.

2. Description of Prior Art

Prior art techniques for A/D conversion are numerous, but fall into a number of general classes, among which are parallel or flash conversion, successive approximation conversion, slope integration conversion, and discrete charge-balancing conversion.

Parallel conversion, also known as flash conversion, is typically the fastest technique, but has the highest implementation cost. In an N-bit A/D converter, there are $2^N$ possible digital number outputs. A total of $2^N-1$ boundaries define the analog input ranges corresponding to the digital number outputs. In parallel conversion; $2^N-1$ analog reference signals which are the bin boundaries are generated. An input is simultaneously compared to each reference signal. The $2^N-1$ comparators produce digital output signals which are decoded to produce the desired digital output number.

Flash conversion is fast because the input-to-output delay includes the reaction times of one comparator stage and the subsequent decoding logic. Flash conversion is costly to implement, because the number of analog reference signals and comparators grows exponentially with N.

Successive approximation (SA) A/D conversion is considerably slower than flash A/D conversion, but has a much lower implementation cost for large N. In successive approximation, a tree search is performed on the possible digital output numbers. The tree search proceeds in a sequence of approximation stages. At each stage, a possible digital output number is passed to an N-bit digital-to-analog (D/A) converter, which produces a corresponding analog value. This value is compared to the analog input signal. The result of the comparison is used to select a new possible digital number value for the following stage.

With respect to components, an N-bit SA-based A/D converter requires one comparator, an N-bit D/A converter, and logic circuits for directing the search and storing the results. The converter and the comparator can be re-used for each stage of the search. The speed of the SA converter depends on N and on the settling times of the comparator, the D/A converter, and the logic circuits. For instance, a 16-bit SA A/D conversion would require 16 comparisons of 16 separate 16-bit D/A conversion results, while an 8-bit SA A/D conversion would require only 8 comparisons of 8 separate D/A conversion results.

A prior art hybrid is the half-flash A/D converter, which has intermediate speed and component cost relative to flash and SA converters. In an N-bit half-flash converter, a first stage N/2-bit flash conversion is performed to obtain the values of the N/2 most-significant bits of the desired digital output number. These bit values are passed to an N/2-bit D/A converter, which provides a gross reconstruction of the analog input. The gross reconstruction is subtracted from the analog input, and the resulting difference is passed to a second N/2-bit flash converter, which produces the N/2 least-significant bits of the desired digital output number.

Clearly, the N/2-bit flash converters used in a half-flash converter have far fewer components than N-bit flash converters. However, the delay includes two flash converter delays and settling times for an N/2-bit D/A converter and an analog subtraction. Thus, a half-flash converter for a suitable N may have lower implementation cost than a corresponding flash converter, but also a slower speed. On the other hand, the N/2-bit flash converters and the N/2-bit D/A converter may have greater implementation cost than an N-bit D/A converter, while being used each once rather than N times. Thus, a half-flash converter may have higher overall implementation cost than that of a corresponding N-bit SA converter, but also a faster speed.

There are other prior art A/D conversion techniques. In techniques based on integration, the time required to charge or to charge and discharge capacitors with reference currents or unknown input-proportional currents is measured using digital counters. Counter outputs are the digital number outputs of the converters. Discrete charge-balancing techniques include delta-sigma A/D conversion and switched-capacitor A/D conversion. In each of these discrete techniques, small packets of charge are selectively applied so as to cancel out the effects of an analog input on an integrator circuit. A counter keeps track of the number of charge packets applied, which is the converter output at the end of the full conversion cycle.

In addition to the number of output bits provided by an A/D converter and the conversion speed, there are a variety of other design issues which are system-dependent. An A/D converter has an allowed range of analog input values. These should be well-matched to the transducers or sensors whose outputs are being converted. Also, it may be desired for the A/D converter to be incorporated on the same chip as other circuitry. A small number of A/D components may be desirable, but it may also be desired that these components be of similar construction to the components of the other circuitry. Also, it may be desired that the components consume a small amount of power.

As an example of a particular system, consider a digital image acquisition device such as a digital camera. The imaging sensors may form an array of 1200 elements by 1000 elements, for a total of 1.2 million sensors. To form a digital image, an output from each sensor must be converted to a corresponding digital number value. In order to allow timely re-use of the imaging array, all 1.2 million conversions should be carried out quickly, perhaps necessitating a single very fast A/D converter or a set of slower A/D converters operating in parallel. It may be desired that the imaging array and processing circuitry be on a single small chip so that the camera is physically very small and can be cheaply manufactured. However, the design may also require long operation time with a low-capacity battery as a power supply.

The principle disadvantages of prior art flash A/D converters are that while they are fast, they typically need a large number of components which use a great deal of chip space and which consume a large amount of power. The exponential increase in component counts and power consumption of flash converters limits the number of bits for which such converters are economically feasible to use. The principle disadvantages of SA A/D converters are that while they have low component cost and are economical for higher precision than are flash converters, they are quite slow and make inefficient use of the resources consumed. Half-flash converters combine the advantages and disadvantages of flash and SA converters. However, there is still plenty of room for alternative conversion techniques which are fast and which have low complexity.

SUMMARY

The present invention is a type of analog-to-digital converter in which a series of flash converters are used to undertake a fast tree search over possible digital output numbers, with efficient generation of analog reference signals for each stage.

OBJECTS AND OBJECTIVES

There are several objects and objectives of the present invention.

It is an object of the present invention to provide an A/D converter which has a much smaller component cost in terms of count and power consumption than comparable prior art flash or half-flash A/D converters.

It is an object of the present invention to provide an A/D converter which has a much faster conversion time than comparable prior art SA A/D converters.

It is an object of the present invention to provide for a class of A/D converters in which it is possible to selectively trade off overall component cost and speed, leading to a variety of designs of various precision, speeds, and costs.

It is an object of the present invention to provide low-cost, high-speed A/D converters for applications such as digital image acquisition or digital video acquisition in which it is necessary to carry out massive numbers of A/D conversions on a block-by-block or frame-by-frame basis.

It is an object of the present invention to provide a pipelined simultaneous A/D converter in which conversion of one analog input to the corresponding digital output may proceed relatively slowly, but in which the conversion rate approximates that of a flash A/D converter with an implementation cost less than that of an SA A/D converter.

Further objects and advantages of the invention will become apparent from a consideration of the ensuing description.

DRAWING FIGURES

In the drawings, closely related figures have the same number but different alphabetic suffixes.

REFERENCE NUMERALS IN DRAWINGS

Figure 1:
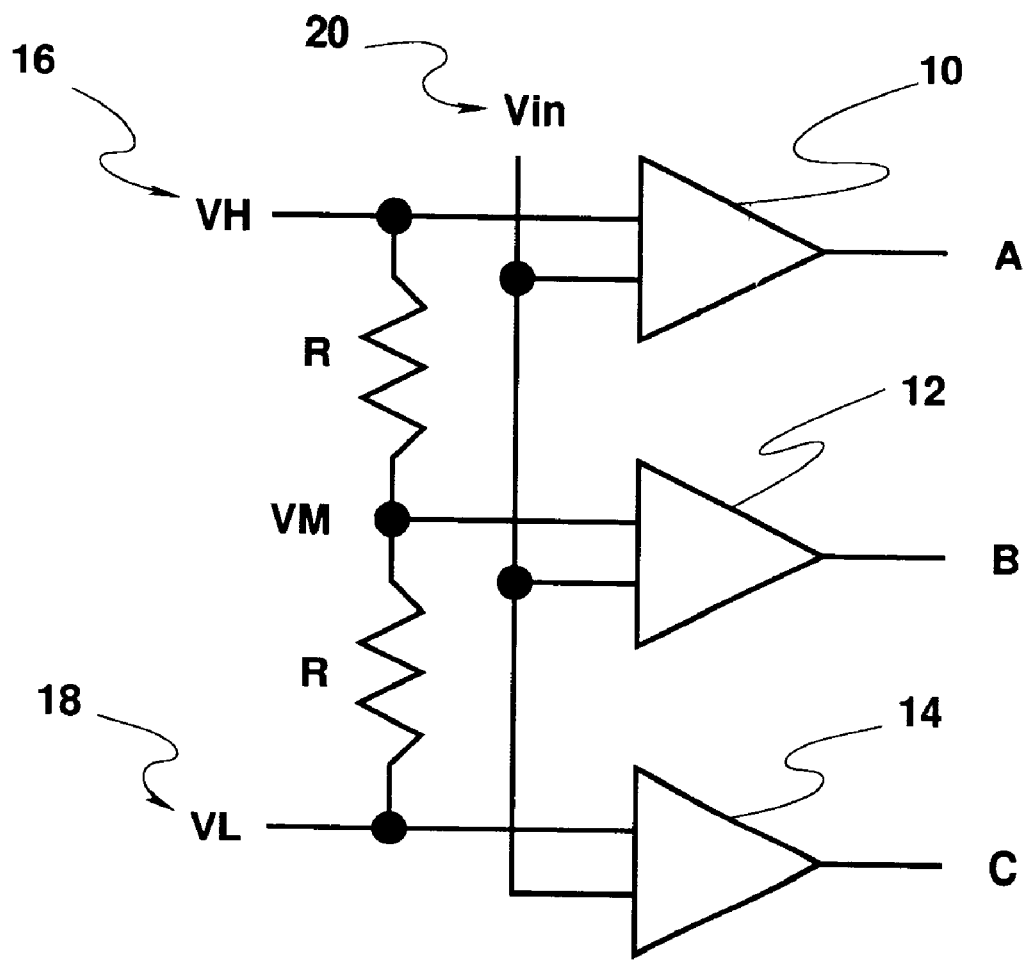
FIG. 1 shows elements of a 2-bit flash A/D converter.

10 a first comparator
12 a second comparator
14 a third comparator
16 a first reference voltage
18 a second reference voltage
20 a first unknown analog input
22 an 8-bit D/A converter
24 a successive approximation register
26 an 8-bit latch and output drivers
28 successive approximation control logic
30 a conversion trigger line
32 a conversion finished line
34 a first 4-bit flash converter
36 a coarse reference voltage
38 a latch and tri-state buffers
40 a 4-bit D/A converter
42 a residue generator
44 a second 4-bit flash converter
46 a fine reference voltage
48 a first-stage comparator
50 a first-stage switch
52 a first pre-generated known reference voltage
54 a second pre-generated known reference voltage
56 a first-stage op-amp
58 a first first-stage input resistor
60 a second first-stage input resistor
62 a first-stage feedback resistor
64 a first-stage op-amp output
66 a second-stage comparator
68 a second-stage switch
70 a second-stage op-amp
72 a first second-stage input resistor
74 a second second-stage input resistor
76 a second-stage feedback resistor
78 a second-stage op-amp output
80 a first reference voltage
82 a first voltage divider resistor
84 a second voltage divider resistor
86 a third voltage divider resistor
88 a first pre-generation op-amp
90 a second pre-generation op-amp
92 one of seven first-stage comparators
94 a first-stage comparator output decoder
96 one of three first-stage switches
98 one of three second-stage comparators
100 a second-stage comparator output decoder

DESCRIPTION—FIG. 1 AND FLASH CONVERSION

As discussed above, a flash converter is fast principally because it considers all possible digital output values in parallel. However, it is costly for the same reason.

FIG. 1 shows elements of a two-bit flash A/D converter. An analog input 20 is applied simultaneously to a first comparator 10, a second comparator 12, and a third comparator 14. A first reference voltage 16 labeled VH and a second reference voltage 18 labeled VL are applied to either end a string of resistors. First reference voltage 16 and second reference voltage 18 have differing values, so that a set of three reference voltages—VH, VM, and VL—are available as inputs to the three comparators.

In a standalone two-bit flash converter, first analog reference voltage 16 and second reference voltage 18 might be generated from other reference voltages, for instance, via additional resistors connected to other reference voltages such as power supply rails and/or ground. For an example of this, see page 621 the second edition of THE ART OF ELECTRONICS by Paul Horowitz and Winfield Hill. Still another possibility for generating reference voltage inputs for the comparators is to charge capacitors.

Whether generated using a resistor string or a capacitor bank, a key feature of the reference voltages applied to comparators in a flash converter is that they represent boundaries between analog bins assigned to different digital output values. Each comparator output takes on a binary value which indicates which input is larger than the other. In the case of inputs to a comparator being close in value and corrupted by noise, it is possible for the comparator output to oscillate. However, the presence of this oscillation does not interfere with conversion. Input offset error of the comparators is not addressed here, but does interfere with conversion.

In FIG. 1, the outputs of the three comparators can take on four possible values, which are, in triplet form (A,B,C), equal to (0,0,0), (0,0,1), (0,1,1), and (1,1,1). Thus there are four bins, which can be described by two bits. The triplet sets allowed for the & comparator outputs in FIG. 1, and, for a bank of M comparators, sets of allowed M-tuples, are sometimes referred to as "thermometric codes" on account of their similarity to the indicator on a liquid-based thermometer. Digital decoding circuitry to provide a regular binary code instead of thermometric code is easy to construct and is fast, but is not shown in FIG. 1 or discussed here.

FIG. 1 shows that, in addition to any logic for decoding of comparator outputs, a flash converter requires at least two analog reference voltages, means for generating any other necessary analog reference voltages, and means for comparing the reference voltages to the input voltage. In particular, a prior art N-bit flash converter requires $2^N-1$ comparators and at least $2^N-2$ resistors if reference generation using a resistor string is used.

In an integrated circuit implementation, the resistors occupy a non-negligible amount of chip space, and dissipate power as current passes through them. The comparators also occupy a non-negligible amount of chip space, and each one has a steady state or quiescent power dissipation in addition to any dynamic power consumed by changing the output state and by driving output loads. The power consumption of the comparators may be particularly large if they are designed for very fast response times, as substantial output currents may be needed to drive capacitive loads.

It is also worthwhile to note that for constant reference voltages feeding the resistor string, the resulting reference voltages can be considered as being pre-generated. In other words, they are not produced as needed during conversion. Another feature of the resistor string of FIG. 1 is that the comparators all have high-impedance inputs, so that the resistor string does not suffer adverse loading effects. Generally speaking, a reference voltage source which is loaded with a small or moderate impedance must have an intermediate active circuit with high input impedance and low output impedance, such as an op-amp configured as a buffer.

DESCRIPTION—FIG. 2 AND SUCCESSIVE APPROXIMATION CONVERSION

If instead of pre-generating a full set of analog reference signals for each conversion, an A/D converter generates a small subset of analog reference signals as they are needed, the chip area and power required to implement the converter can be greatly reduced. Referring again to FIG. 1, the parallel comparators may provide redundant information. For instance, if VH is greater than VL, and first unknown analog input 20 is greater than VH, then the outputs of second comparator 12 and third comparator 14 provide no additional information beyond that provided by the output of first comparator 10.

The basic idea of successive approximation (SA) A/D conversion techniques is to use multiple stages of comparison which gradually generate an analog reference signal which is roughly equal to the unknown signal being converted. Comparator outputs of one stage can be used to select which analog reference signal is generated in a subsequent stage.

One advantage of SA techniques is that fewer comparisons must be made relative to flash conversion, resulting in a reduced cost in terms of chip space and power consumption for reasonably large precision values. A major disadvantage of SA conversion is that the total time between the start and the completion of a conversion is increased relative to the total time required for a flash conversion. In addition to the time required to obtain the results of comparison and comparator output decoding, an SA converter must allow time for the circuits which implement selective generation of analog reference signals to settle.

Figure 2:
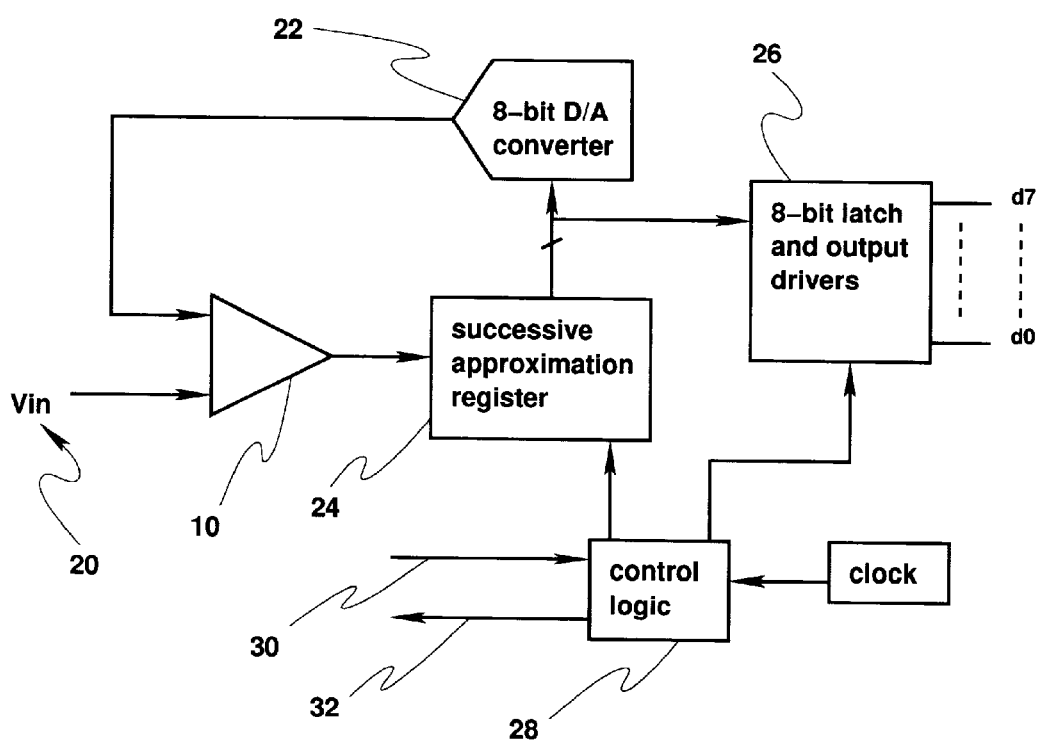
FIG. 2 shows a block diagram of an 8-bit successive approximation A/D converter.

Prior art SA converters can have relatively compact implementations. FIG. 2 shows a block diagram of an 8-bit SA A/D converter taken from page 623 of the second edition of THE ART OF ELECTRONICS. The principal components are a first comparator 10, an 8-bit D/A converter 22, a successive approximation register 24, an 8-bit latch and output drivers 26, and successive approximation control logic 28.

When the successive approximation control logic 28 receives a conversion initiation signal on conversion trigger line 30, it directs successive approximation register 24 to provide a first 8-bit value stored in the register to 8-bit D/A converter 22. This first 8-bit value is usually representative of the midpoint of the ordered range of possible 8-bit digital number representations.

8-bit D/A converter 22 converts the 8-bit value to a first analog reference value, which it provides as one input of first comparator 10. First unknown analog input 20 is provided as the other input of first comparator 10. Upon settling, the output of first comparator 10 indicates which of the two inputs is greater, and is used to change bits stored in successive approximation register 24. 8-bit D/A converter 22 then converts the new 8-bit value to a second analog reference value, which it provides as input to first comparator 10.

During a first cycle of the SA conversion process, one output bit is determined. During each subsequent cycle, one additional output bit is determined. In FIG. 2, after 8 cycles, successive approximation control logic 28 releases the 8-bit digital output by way of the 8-bit latch and output drivers 26, and also provides a conversion completion signal on conversion finished line 32.

The advantages of an A/D converter according to the block diagram of FIG. 2 are several. Only one comparator is needed for the entire converter. This comparator is re-used from stage to stage, as are the D/A converter and the successive approximation register. The result is an implementation which uses relatively little space on a chip and which also uses relative little power.

There are at least two disadvantages to the prior art SA converter of FIG. 2. One is that the conversion is relatively slow. For an N-bit SA conversion, N cycles are necessary.

Each cycle requires time for one N-bit D/A converter output to settle and time for one comparator output to settle, in addition to any digital logic delays. D/A converter output settling time increases as a function of N, so that the overall A/D conversion time increases more than linearly with N. During this whole time, the unknown analog input signal must be applied to a comparator input which implies a need for sample-and-hold circuitry not shown in FIG. 2.

A second disadvantage of the prior art SA converter of FIG. 2 is that the resources consumed are used inefficiently. For instance, the first processing stage only requires a 1-bit D/A conversion, but employs an 8-bit D/A converter, while the second processing stage only requires a 2-bit D/A conversion, but employs an 8-bit D/A converter. Low-resolution D/A converters require less chip space and consume less power than high-resolution D/A converters. Of course, multiple low-resolution D/A converters may require more chip space than a single high-resolution D/A converter.

DESCRIPTION—HALF-FLASH CONVERSION

Flash converters and SA converters seem to represent extremes of design specifications. Flash converters offer the fastest conversion speeds, but at the expense of chip space and power consumption that grow exponentially with the number of bits of resolution. SA converters offer an extremely compact design that occupies a very small amount of chip space, but at the expense of a long conversion time that is in the best case a linear function of the number of bits of resolution.

It would be very useful to have a class of A/D converters which are intermediate in both speed and cost. For instance, when more chip space and power are available than are required by an SA A/D converter, but not enough are available for a flash A/D converter, alternative A/D converters which make efficient use of resources would be desirable.

Figure 3:
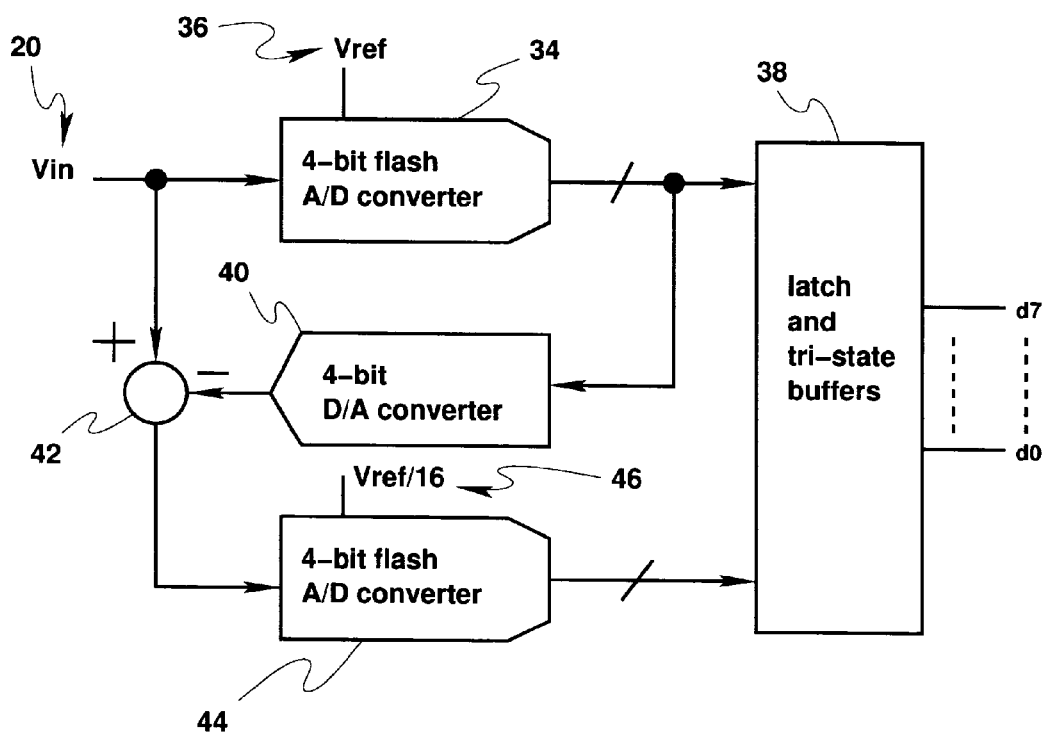
FIG. 3 shows a block diagram of an 8-bit half-flash A/D converter.

An attempt to compromise on speed and cost in the prior art is the half-flash converter. FIG. 3 shows a half-flash converter based on the block diagram on page 622 of THE ART OF ELECTRONICS. A first unknown analog input 20 is passed as input to a first 4-bit flash converter 34 which has pre-generated reference voltages set according to a coarse reference voltage 36. The output bits of first 4-bit flash converter 34 are passed to latch and tri-state buffers 38 as the four most-significant bits of the desired digital output. The output data of first 4-bit flash converter 34 are also passed to 4-bit D/A converter 40.

4-bit D/A converter 40 reconstructs a coarse approximation of first unknown analog input, which it provides to residue generator 42. The other input to residue generator 42 is first unknown analog input 20. The term "residue" is used in prior art literature to describe the difference between an unknown analog input and a reconstruction of that input. In particular, as shown in FIG. 3, the residue consists of the reconstruction of first unknown analog input 20 subtracted from first unknown analog input 20. As such, the residue is positively scaled with respect to the first unknown analog input 20.

The prior art literature is rife with multi-stage A/D converters which compute residues as stage outputs. However, the residues are invariably positively scaled with respect to the unknown analog input which contributes to the residue. Negative scaling is a key feature of the present invention, as discussed in succeeding sections.

Returning again to FIG. 3, the residue is passed as input to a second 4-bit flash converter 44, which has pre-generated reference voltages set according to a fine reference voltage 46. Otherwise, the structure of second 4-bit flash converter 44 can be the same as that of first 4-bit flash converter 34. The output bits of second 4-bit flash converter 44 are passed to latch and tri-state buffers 38 as the four least-significant bits of the desired digital output number.

Relative to full flash converters and SA converters, half-flash converters have several advantages and disadvantages. The half-flash converter of FIG. 3 clearly requires time for first 4-bit flash converter 34 to provide output bits, time for these output bits to be D/A converted by 4-bit D/A converter 40, time for residue generator 42 to produce the residue, and time for second 4-bit flash converter 44 to provide output bits. Thus, the half-flash converter is considerably slower than a full flash converter. However, the fact that there are only 2 stages rather than 8 stages makes the half-flash converter faster than an SA converter.

The 8-bit half-flash converter of FIG. 3 seems to make more efficient use of the D/A conversion resources than a corresponding 8-bit SA converter. 4-bit D/A converter 40 is used once during a conversion, in comparison with 8 uses of 8-bit D/A converter 22 in the circuit of FIG. 2. 4-bit D/A converter 40 of FIG. 3 may also have a smaller circuit area and power consumption than 8-bit D/A converter 22 of FIG. 2. On the other hand, the 8-bit SA converter requires only one comparator, while each of the 4-bit flash converters in the 8-bit half-flash converter requires 15 comparators in addition to means for generating suitable reference voltages. An 8-bit flash converter would require 255 comparators and means for generating 255 reference voltages.

In FIG. 3, residue generator 42 requires chip space, power, and settling time. More generally, in any multi-stage A/D converter with one or more residue generators, chip space, power, and settling time are required for each residue generator.

With regard to the design of A/D converters having intermediate speed and cost relative to flash and SA converters, speed increases and cost reductions are desirable. Cost reductions are possible when relatively small numbers of parts are used, particularly if they are shared parts. They may occupy a relatively small amount of space on a chip and may consume a relatively small amount of both quiescent and active power. Speed increases are possible when relatively small numbers of successive stages are used. Each circuit element with a parameter that changes during conversion requires a finite settling time. Such circuit elements may include comparators, op-amps, switches, and charged capacitors. When one variable-parameter component follows another, the settling time for the series combination is always greater than the larger of the two component settling times.

DESCRIPTION—THE PREFERRED EMBODIMENT OF FIG. 4A

Figure 4A:
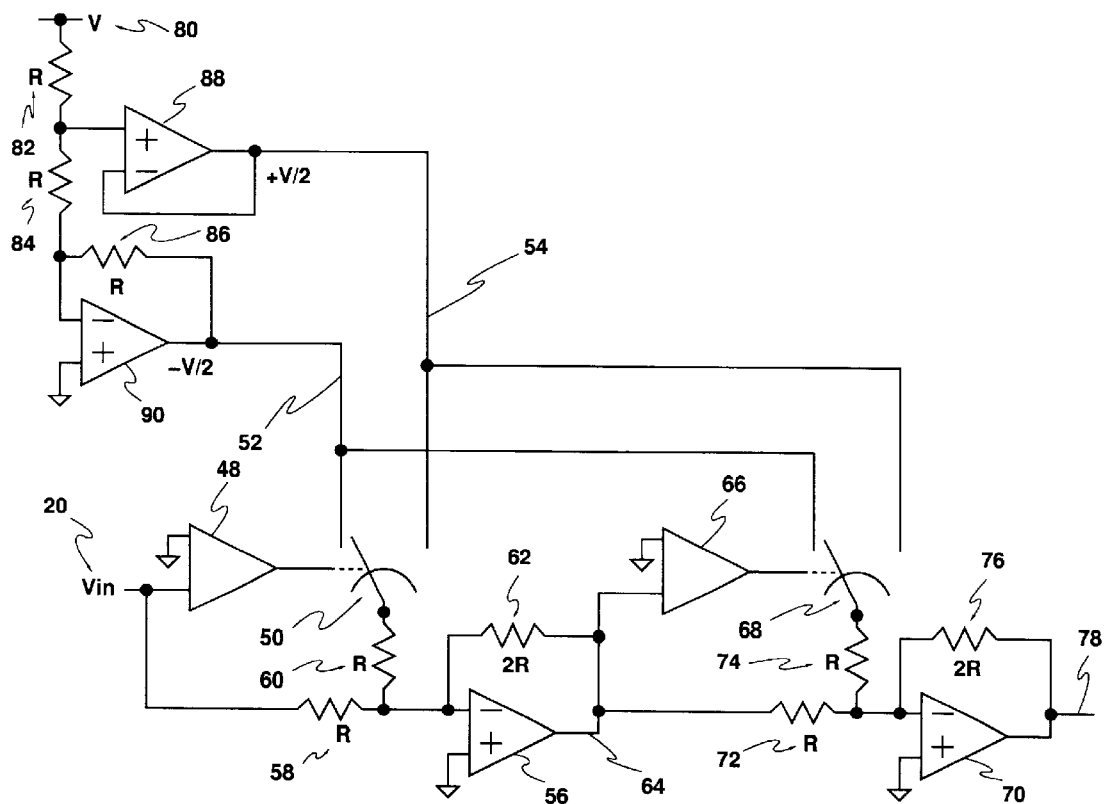
FIG. 4A shows a preferred embodiment of the present invention with two one-bit stages, efficient pre-generation of known reference signals, and built-in residue scaling.

The preferred embodiment of the invention is shown in FIG. 4A, and contains aspects of several claims. The preferred embodiment represents portions of a multi-stage A/D converter in which a first stage provides one bit of information for producing a negatively-scaled residue, which is passed as input to a second stage. The second stage is very similar in construction to the first stage, and like the first stage provides one bit of information for producing a second negatively-scaled residue.

In the preferred embodiment of FIG. 4A, a first unknown analog input 20 is applied as an input to a first-stage comparator 48. First unknown analog input 20 is also applied to first first-stage input resistor 58, which is connected to the inverting input of first-stage op-amp 56.

The output of first-stage comparator 48 controls first-stage switch 50. First-stage switch 50 can select either a first pre-generated known reference voltage 52 or a second pre-generated known reference voltage 54. Assuming a first reference voltage 80 with a value V is either a maximum or a minimum allowed voltage, first pre-generated known reference voltage 52 having a value +V/2 and second pre-generated known reference voltage 54 having a value −V/2 are first-stage adjustment signals. The selected first-stage adjustment signal is connected to second first-stage input resistor 60, which is also connected to the inverting input of first-stage op-amp 56.

First-stage op-amp 56 has a first-stage op-amp output 60 which is connected to the inverting input of first-stage op-amp 56 via first-stage feedback resistor 62. As indicated in the figure, first-stage feedback resistor 62 has a resistance which is twice that of the common resistance value of first first-stage input resistor 58 and second first-stage input resistor 60. The value of first-stage output 64 is the negative of twice the sum of the value of first unknown analog input 20 and the selected first-stage adjustment signal.

In operation, if first unknown analog input 20 is greater than the ground reference provided as the second input to first-stage comparator 48, V/2 should be subtracted from first unknown analog input 20 to provide a residue signal, assuming that V is positive. Thus first-stage switch 50 should be connected to first pre-generated known reference voltage 52. The difference between first unknown analog input 20 and V/2 has a value between V/2 and minus V/2. However, this difference appears at first-stage op-amp output 64 scaled by negative two.

The negative portion of the scaling factor could be eliminated with a resistor-based inverting amplifier after first-stage op-amp output 64. However, this additional circuitry would require additional chip space, would consume additional power, and would increase the time required for the conversion. Instead, the negatively-scaled combined signal which is the actual residue is applied directly as an input to a second-stage comparator 66 and to a first second-stage input resistor 72.

In the second stage, second-stage comparator 66 controls a second-stage switch 68. Second-stage switch 68 can be used to select either first pre-generated known reference voltage 52 or second pre-generated known reference voltage 54 as a second-stage adjustment signal. The selected adjustment signal is applied to second second-stage input resistor 74.

First second-stage input resistor 72 and second second-stage input resistor 74 are connected to the inverting input of second-stage op-amp 70. Second-stage op-amp output 78 is connected to the inverting input of second-stage op-amp 70 via second-stage feedback resistor 76. The value of second-stage op-amp output 78 is the sum of the value of first-stage op-amp output 64 and the second-stage adjustment signal provided via second-stage switch 68, scaled by negative two.

The comparison and combining circuits of FIG. 4A are substantially the same. A third stage could be included, or a fourth, and so on. A final stage would use a comparator, but would not require selection of an adjustment signal and combining. Each stage that is a one-bit stage with an input between plus V and minus V can use the same pair of pre-generated known reference voltage sources for producing the negatively-scaled stage output signal.

FIG. 4A includes means for pre-generating the pre-generated known analog reference signals. In particular, a source of a first reference voltage 80 V is connected to one end of a resistor string having a first voltage divider resistor 82, a second voltage divider resistor 84, and a third voltage divider resistor 86. First pre-generation op-amp 88 is configured as a buffer and taps the voltage divider between first voltage divider resistor 82 and second voltage divider resistor 84, thus providing second pre-generated known reference voltage 54. Second pre-generation op-amp 90 has its output connected to its inverting input via third voltage divider resistor 86, while its non-inverting input is connected to a reference ground.

The pre-generation circuit in FIG. 4A uses three resistors and two op-amps. The op-amps are particularly important because the input resistors of the combining circuits of the conversion stages are low-impedance loads. On the other hand, the comparator circuits of the conversion stages are high-impedance loads. Generally speaking, when it comes to pre-generation of signals, op-amps are required for reference voltage signals which are used as adjustment signals, while op-amps are not required for reference voltage signals that are only used as comparator inputs.

Alternative embodiments of the invention can have feedback resistors with resistance values equal to those of the corresponding input resistors, for a negative scaling factor of minus one in a stage. Then, rather than using the same set of pre-generated known analog reference voltages for each stage, a different set would be needed. With one-bit stages as in FIG. 4A, a first stage could use plus V/2 and minus V/2 as adjustment signals, while a second stage could use plus V/4 and minus V/4 as adjustment signals, while a third stage could used plus V/8 and minus V/8 as adjustment signals, and so on.

An efficient circuit for generating plus V/4 and minus V/4 adjustment signals would be a three-resistor, two-op-amp circuit much like the pre-generation circuit shown in FIG. 4A, with a reference signal of either plus V/2 or minus V/2, which can be supplied by the pre-generation circuit shown in FIG. 4A. For a series of one-bit stages however, the cost of each additional layer of binary-scaled pre-generated known reference voltages is three resistors and two op-amps, while the cost of scaling by minus two in each stage rather than by minus one is one 2R resistor replacing one R resistor.

The emphasis of the present invention is on A/D converters that have increased speed and reduced cost, as measured by chip space, power consumption, and other costs. The speed increase comes principally from removing series components of multi-stage A/D converters that introduce settling delays. With resistive signal combining circuits such as those of FIG. 4A, an inverting op-amp and associated resistors can be removed from each combining stage.

With such an inverting op-amp, there would effectively be two inverting op-amps in series. Any non-unity gain should be produced by suitable scaling the second inverting op-amp's feedback resistor relative to the input resistors of both op-amps and the feedback resistor of the first inverting op-amp. A positive pre-generated known reference signal could be applied to the inverting input of the first op-amp to add that signal to the unknown input, or to the inverting input of the second op-amp to subtract it from the unknown input.

Without a second inverting op-amp in the combining circuit, it becomes necessary to pre-generate both a positive pre-generated known reference voltage and the corresponding negative pre-generated known reference voltage.

However, as shown in FIG. 4A, there are low-cost ways to pre-generate both.

DESCRIPTION—THE ALTERNATIVE EMBODIMENT OF FIG. 4B

For a one-bit stage, a pre-generated known reference voltage used for comparison can be a local ground, while pre-generated known reference voltages used as adjustment signals are +V/2 and −V/2, where +V and −V are maximum and minimum voltage limits. Alternative embodiments of the invention can have stages which determine more than one bit of an unknown analog input simultaneously. These embodiments are effectively equivalent to parallel or flash conversion of an unknown stage input with generation of a residue that is within plus or minus one-half of the smallest bin size.

In multi-bit stages, the set of pre-generated known analog inputs must include bin boundaries to be applied to comparator inputs and adjustment signals to be applied to the summing op-amp circuits. For instance, a 2-bit stage with +V and −V as above would need three reference voltages for three comparators. The voltages would be +V/2, 0, and −V/2. A 3-bit stage would need seven voltages for seven comparators, the voltages being +3V/4, +V/2, +V/4, 0, −V/4, −V/2, and −3V/4. For an N-bit stage, there are $2^N-1$ bin boundaries to be applied to comparators.

There are several possibilities for pre-generating known reference signals used as adjustment levels in a multi-bit stage. For an N-bit stage, there are $2^N$ bin centers. One possibility is to pre-generate a voltage corresponding to each possible bin center. In a 2-bit stage, the bin center voltages would be +3V/4, +V/4, −V/4, and −3V/4, while in a 3-bit stage, the bin center voltages would be +7V/8, +5V/8, +3V/8 +V/8, −V/8, −3V/8, −5V/8, and −7V/8. There are several difficulties with this approach. One difficulty is that the adjustment signals are all different from the comparison signals. Another is that the number of adjustment signals grows exponentially with N. To avoid scaling of the pre-generated reference signals for subsequent N-bit stages, a feedback resistor with resistance $2^N R$ relative to resistance-R input resistors should be used. Finally, a large amount of decoding and switching-circuitry may be needed to connect bin-center reference sources to the summing op-amp. A benefit of the approach is that only two input resistors are needed for each stage's summing op-amp.

Another possible approach is to pre-generate N positive and N negative component adjustment signals, with combination in an N-bit stage of N component signals with the unknown stage input. For instance, the bin center voltages of a 2-bit stage can be obtained by adding +V/2 or −V/2 to +V/4 or −V/4, while the bin center voltages of a 3-bit stage can be obtained by adding +V/2 or −V/2 to +V/4 or −V/4 to +V/8 or −V/8. The disadvantage of this approach is that more than two input resistors are needed for the summing op-amp circuit of a multi-bit stage. Advantages of this approach include relatively simple decoding and switching logic and the fact that all but one pair of the adjustment signal voltages are also comparison signal voltages. The pre-generation circuitry can have a much lower cost than that of the first approach described above.

Additionally, it is possible to choose an intermediate number partial bin center voltages that are pre-generated, with a reduced number of component signals required to complete generation. For example, a 3-bit stage could have the pre-generated partial bin center voltages of +3V/4, +V/4, −V/4, and -3V/4, and component signal voltages of +V/8 and −V/8. The pre-generated partial bin voltages are required as comparison voltages, and the component signal voltages can be pre-generated from +V/4 or from −V/4 at very low cost.

Figure 4B:
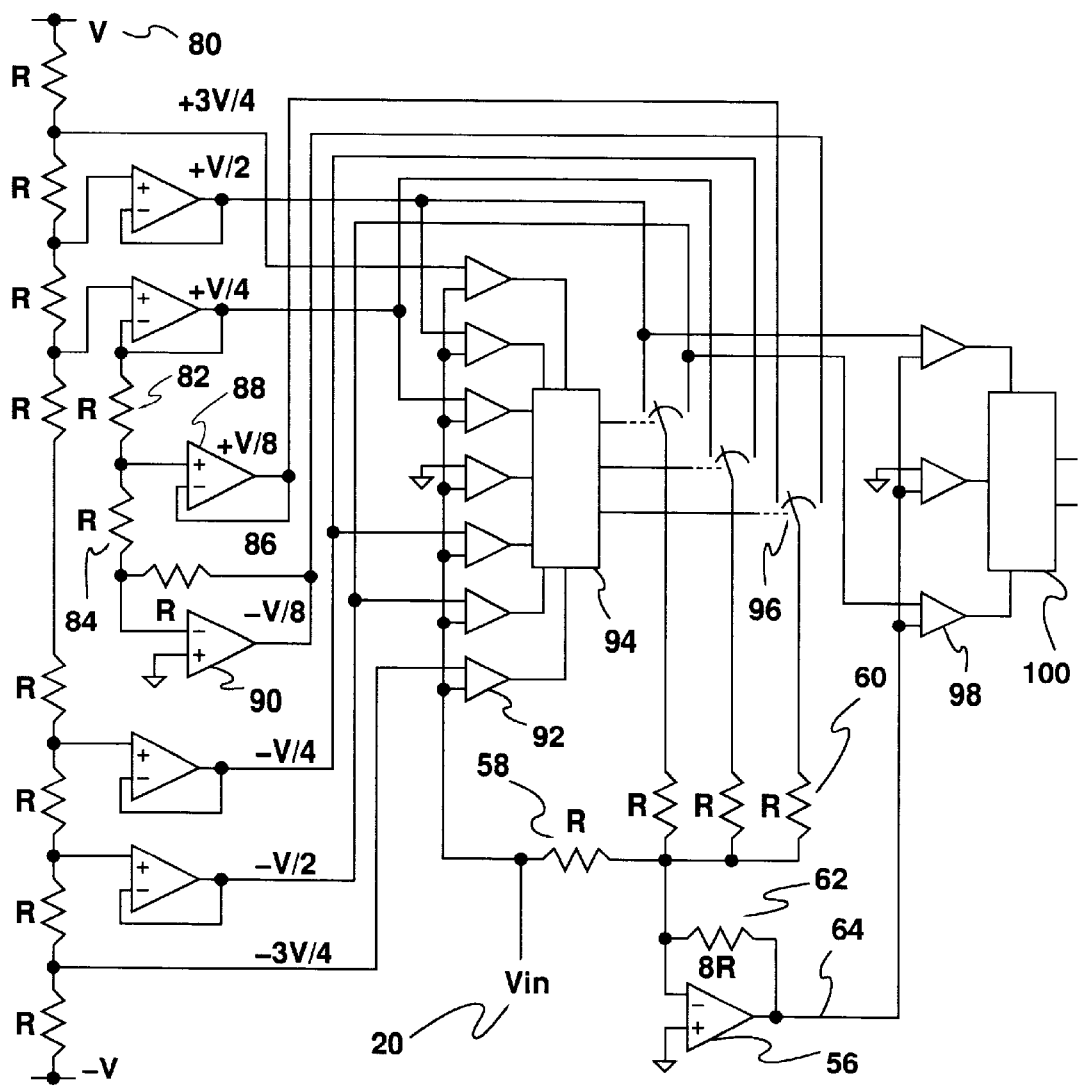
FIG. 4B shows an alternative embodiment of the present invention with a three-bit first stage, a two-bit second stage, built-in residue scaling, four input resistors for the first summing op-amp, and three input resistors for the second summing op-amp.

FIG. 4B shows a 3-bit stage followed by a 2-bit stage. A first unknown analog input 20 is applied to one of seven first-stage comparators 92 as well as to six other first-stage comparators and to a first first-stage input resistor 58. The outputs of the seven first-stage comparators are applied to a first-stage comparator output decoder 94, which in turn controls three first-stage switches. As shown in the figure, one of three first-stage switches 96 passes either +V/8 or −V/8 to second first-stage input resistor 60. The other two switches pass +V/4 or −V/4 and +V/2 or −V/2, respectively, to two other first-stage input resistors.

First-stage op-amp 56 accepts at its inverting input first unknown analog input 20 provided through first firsts stage input resistor 58 as well as adjustment signals passed through the other input resistors. First-stage feedback resistor 62 is connected to the inverting input of first-stage op-amp 56 and also to first-stage op-amp output 64. Since this stage is a 3-bit stage, the feedback resistor has a resistance that is eight times that of the input resistors. Thus, the value of first-stage op-amp output 64 is a residue signal in the range of +V to −V.

As shown in the figure, first-stage op-amp output 64 is passed to one of three second-stage comparators 98, as well as to two other second-stage comparators. The outputs of these three comparators are passed to a second-stage comparator output decoder 100.

The circuits depicted in FIG. 4B could be portions of a multi-stage A/D converter having more than 5 bits of precision. There could be second-stage combining circuitry connected to first-stage op-amp output 64. There could be direct connections to other stages capable of determining 1, 2, 3, 4, or more bits. Alternatively, there could be means for sampling and holding the value of first-stage op-amp output 64 prior to application to a third stage. With means for isolating one stage or set of stages from other stages or sets of stages, it is possible to design pipelined multi-stage converters embodying the present invention. In a pipelined converter, the rate at which analog inputs can be converted to digital outputs depends largely on the longest stage delay and accompanying sampling time. An individual input may be processed by many stages, but multiple inputs can be processed simultaneously in the pipeline of stages.

In addition to two multi-bit comparison and combining stages, the circuit of FIG. 4B also includes means for pre-generating both comparison signals and adjustment signals. In particular, first reference voltage 80 having a value V is connected to a string of 8 series resistors having a common resistance value R. The other end of the resistor string is connected to a reference voltage −V.

The pre-generation means for signals which are only used for comparison in either of the stages comprises a wire connecting a tap on the resistor string to the appropriate comparator or comparators. As shown, there are only two pre-generated known reference voltages which are used only as comparator inputs. These two voltages have values of +3V/4 and −3V/4. Again, note a presumption of comparators which present a high input impedance, such as can be provided by field-effect transistor (FET) technologies.

There are four pre-generated known reference voltages that are provided to both comparator inputs and to input resistors of the combining op-amp. These reference voltages are provided by four op-amps configured as buffers. Each buffer op-amp output is connected to a first-stage comparator and to a first-stage switch terminal. Two of the buffer op-amp outputs are also connected to second-stage comparators.

There are two pre-generated known reference voltages that are used as adjustment signals only in the first stage. These are pre-generated via first voltage divider resistor 82, second voltage divider resistor 84, third voltage divider resistor 86, first pre-generation op-amp 88, and second pre-generation op-amp 90. This portion of the pre-generating circuitry is essentially the same as the pre-generating circuitry of FIG. 4A. However, since it is fed from a +V/4 reference voltage, the resulting voltages are +V/8 and −V/8. The circuitry could be fed from the −V/4 reference voltage instead, if desired.

FIG. 4B shows portions of a multi-stage A/D converter having multi-bit stages which can compute different numbers of bits simultaneously. The pre-generation means are efficient, with the set of pre-generated known reference signals necessary for comparators having significant overlap with the set of pre-generated known reference signals used for adjustment. The pre-generating means provide pre-generated known reference signals to multiple stages. This sharing allows reductions in the overall cost of the converter, particularly when large numbers of stages are used. Note also that the pre-generating means for one multi-stage A/D converter could also be used for other multi-stage A/D converters simultaneously.

FIG. 4B shows only two resistor values, which are R and 8R. This is for the purpose of illustration. There is no requirement that all of the resistors in the pre-generating circuitry have substantially equal values. Also, the input resistors are not required to have the same resistance values as the resistors of the pre-generating circuitry. Two sets of resistor ratios are important. The resistors in the pre-generating circuitry should be selected so as to provide the desired pre-generated known reference voltages. The resistors in the combining circuit should be selected to provide the desired weighting to the input and adjustment signals and to provide the desired negative scaling factor of the summing op-amp output.

An alternative embodiment not depicted in FIG. 4B could have pre-generated known reference voltages which are applied to input resistors having different resistance values. This might result in a smaller set of required pre-generated known reference signals and a corresponding reduction in the cost of the pre-generating circuitry. However, there might be an increase in the cost of the combining circuitry, particularly the cost of scaled, matched resistors for multiple stages.

Referring again to the specific details of FIG. 4B, note that first-stage feedback resistor 62 has a resistance value which is 8 times larger than the common resistance value of the input resistors. This results in an error signal or residue with a value between +V and −V. If the circuit were to use +V/8 and −V/8 as second-stage comparator inputs in place of the +V/2 and −V/2 second-stage comparator inputs shown, first-stage feedback resistor 62 could have a value of only 2R, resulting in a residue having a value between +V/4 and −V/4, for which the second stage would provide the same desired digital results. Thus, it is not always necessary for an N-bit stage to have a $2^N$-scaled feedback resistor.

The generation of digital output values for the A/D converter's digital output number has thus far been omitted from the discussion of FIG. 4B. In fact, these digital values can be obtained quite simply from the set of settled comparator outputs of a given stage. With multi-bit stages, there is a need for conversion from the thermometric output format to a desired binary format. Of course, it is entirely possible to have other formats such as decimal, ternary, octal, et cetera—which can be generated indirectly from a binary converter structure or even directly using a non-power-of-two converter structure. For instance, a decimal A/D converter could be designed having 9 comparators defining 10 bins corresponding to one digit.

The only caveat in determining the digital output values is that the polarity of the inter-stage residue signals with respect to the original unknown analog input being converted alternates. The alternating polarity must be taken into account when mapping the comparator outputs to digital number values.

As an example, suppose that FIG. 4B represents a 5-bit A/D converter. Let a value of V be applied as first unknown analog input 20, and let each comparator be wired to produce a signal interpreted as a logical 1 if the lower input in the diagram is greater than the upper input, and a signal interpreted as a logical 0 otherwise. The value of first-stage op-amp output 64 will be −8(V −V/2−V/4−V/8)=−V on the basis of all 8 first-stage comparators producing logical 1 signals. As an input to the second-stage comparators, a value of −V would result in three logical 0 signals. The negatively-scaled residue is less than all of the second-stage bin boundaries, which is essentially equivalent to a positively-scaled residue being greater than all of the second-stage bin boundaries.

One solution to this problem is to switch the inputs of the comparators in one type of stage—either of those stages with an input negatively-scaled with respect to the converter input or of those stages with an input positively-scaled with respect to the converter input—so that the thermometric interpretation is the same across all stages. Another solution is to modify the digital logic which provides the output bits for each stage.

DESCRIPTION—OTHER ALTERNATIVE EMBODIMENTS

FIG. 4A showed an embodiment of the present invention with two one-bit stages and direct feed of a first-stage output to second-stage comparator and summing circuit inputs. FIG. 4B showed an embodiment of the present invention with a three-bit stage followed by a two-bit stage, the latter of which could have been either a final stage or a portion of an intermediate stage.

There are many alternative embodiments, some of which were suggested in the discussion of FIGS. 4A and 4B. Alternative embodiments can have multi-bit stages, more than two stages, stages with or without negative gains of less than one, stages with differing sets of pre-generated known reference signals and stages with substantially identical sets of pre-generated known reference signals. Alternative embodiments can have stages that share pre-generation means, and pre-generation means can also be shared between multiple simultaneous converters. Alternative embodiments can have a very simple structure with stage inputs passed directly along the sequence of stages. Other alternative embodiments can have sample-and-hold means between each stage or intermittently, thus enabling a pipelined converter architecture or a cyclic converter architecture.

For a given multi-bit stage size, there are many alternative embodiments with different sets of adjustment signals, input resistor values, and feedback resistor values. Particularly useful embodiments are those which have compact, low-cost pre-generation means. A desired set of adjustment signal values may be pre-generated, or else generated by a stage's combining circuit from pre-generated components.

Alternative embodiments can include various pre-generation means. Useful pre-generation means should have a driver or buffer with low output impedance for each pre-generated known reference signal provided as an adjustment signal. Pre-generated known reference signals which are applied only to comparator inputs may or may not require a buffer, depending on the type and number of comparators to which they are applied. The pre-generation means shown in FIGS. 4A and 4B use resistors as components, but alternative embodiments might use one or more capacitors, for instance, in the form of a charged capacitor array.

The underlying idea of the, invention of negatively-scaled combining could be applied to reduce the delay and complexity of prior art half-flash converters such as that of FIG. 3. For instance, residue generator 42 could be replaced with a residue generator producing a negatively-scaled combination of first unknown analog input 20 and the output of 4-bit D/A converter 40, However, an even more efficient scheme would be to use the reference levels pre-generated for first 4-bit flash converter 34 for both first 4-bit flash converter 34 and second 4-bit flash converter 44, and for pre-generating adjustment signals to be used in a combining stage that directly combines them with first unknown analog input 20 providing a negatively-scaled residue. Second 4-bit flash converter 44 could be re-wired to accommodate the polarity inversion of the residue.

CONCLUSION, RAMIFICATIONS, AND SCOPE

The reader will see that the present invention has several advantages over prior art techniques for analog-to-digital (A/D) conversion. Among these is an increase in conversion speed which results from removing series components—in particular inverting amplifier circuits—which introduce delay and which also results from pre-generating known analog reference signals rather than generating these signals as needed. Removing the series components results in a stage output which is negatively scaled with respect to the stage input, but compensating for the negative scaling is quite easy. Removing the series components forces the use of pairs opposite-polarity buffered reference signals, but these may already be available or else are easy to provide.

Another important advantage is the reduction in cost. The cost of the eliminated series components is recouped. Pre-generation circuitry can be shared among stages in one converter as well as among converters, producing substantial cost savings. In addition to the cost in terms of component count and associated chip area and power consumption, the cost of fabrication may be reduced, particularly with regard to component matching. Thin-film resistor matching may be a much simpler and less costly process than the matching of capacitors.

The description above contains many specific details relating to resistor values, numbers of stages, stage precision, converter precision, pre-generating means, circuit components, delays, costs, chip area requirements, power consumption, fabrication, applications, comparator output interpretations, decoding, switching, combining, adjustment, D/A conversion, A/D conversion, resistance values, relative resistance values, reference voltage values, and relative ground values. These should not be construed as limiting the scope of the present invention, but as illustrating some of the presently preferred embodiments of the invention. The scope of the invention should be determined by the appended claims and their legal equivalents, rather than by the examples given.

I claim:
1. A machine used for analog-to-digital conversion, comprising:
   a. a first set of pre-generated known analog reference signals
   b. a second set of pre-generated known analog reference signals
   c. a first-stage unknown analog input signal
   d. a first stage having as inputs said first set of pre-generated known analog reference signals and said first-stage unknown analog input signal, said first stage comprising:
      i. a first number of comparing means for comparing said first-stage, unknown analog input signal to a first number of members of said first set of pre-generated known analog reference signals, producing a first number of first-stage comparison signals
      ii. means for selecting a second number of first-stage adjustment signals from said first set of pre-generated known analog reference signals, based on said first-stage comparison signals
      iii. means for combining said first-stage adjustment signals and said first-stage unknown analog input signal to produce a first-stage analog output signal, said first-stage analog output signal being substantially equal to a scaled sum of said first-stage unknown analog input signal and said first-stage adjustment signals, said scaled sum having a negative scaling factor with respect to said first-stage unknown input signal
   e. a second stage having as inputs said second set of pre-generated known reference signals and a second-stage unknown analog input signal which is either said first-stage analog output signal or a signal substantially equal to said first-stage analog output signal, said second stage comprising a third number of comparing means for comparing said second-stage unknown analog input signal to a third number of members of said second set of pre-generated known analog reference signals, producing a third number of second-stage comparison signals
   whereby said first-stage analog output signal is not negated to produce a positively-scaled sum with respect to said first unknown analog input, thus saving the resource cost of an inverting amplifier circuit or the resource cost of switching means for inverting the connections of a charged capacitor.
2. The machine of claim 1 in which:
   a. said second stage further includes:
      i. means for selecting a fourth number of second-stage adjustment signals from said second set of pre-generated known analog reference signals, based on said second-stage comparison signals
      ii. means for combining said second-stage adjustment signals and second-stage unknown analog input signal to produce a second-stage analog output signal, said second-stage analog output signal being substantially equal to a scaled sum of said second-stage unknown analog input signal and said second-stage adjustment signals
   b. a third stage has as inputs a third set of pre-generated known analog reference signals and a third-stage unknown analog input signal which is either said second-stage analog output signal or a signal substantially equal to said second-stage analog output signal, said third stage comprising a fifth number of comparing means for comparing said third-stage unknown analog input signal to a fifth number of members of said third set of pre-generated known analog reference signals, producing a sixth number of third-stage comparison signals whereby the analog-to-digital conversion occurs in stages, with each stage comparing an unknown analog input signal to one or more pre-generated known reference signals, with a stage's unknown analog input signal combined with adjustment signals to provide an unknown analog input signal for the next stage, when there is a next stage.

3. The machine of claim 1 in which said first number is not the same as said third number, whereby said first stage can perform comparisons that reveal one number of bits in the digital representation of an analog signal being converted, while said second stage can perform comparisons that reveal a different number of bits in the digital representation of the analog signal being converted.

4. The machine of claim 1 in which said first number is the same as said third number, whereby said first stage and said second stage can perform comparisons that reveal the same number of bits in the digital representation of an analog signal being converted.

5. The machine of claim 1 in which:
  a. said first number is equal to two to a first power N, minus one, with said first power N a positive integer
  b. said second number is equal to said first power N whereby said first stage can implement N-bit parallel comparison and corresponding adjustment of said first-stage unknown analog input.

6. The machine of claim 1 in which said negative scaling factor is substantially equal to the negative of two to the power M, where M is a non-negative integer.

7. The machine of claim 1 in which said first set of pre-generated known analog reference signals is substantially the same as said second set of pre-generated known analog reference signals.

8. The machine of claim 1 further including means for sampling and holding said first-stage analog output signal and for providing a sampled-and-held signal which is substantially equal to said first-stage analog output signal as said second-stage unknown analog input signal.

9. The machine of claim 8 in which said comparing means of said first stage are the same components as said comparing means of said second stage, whereby analog-to-digital conversion can proceed in stages which re-use circuitry cyclically.

10. The machine of claim 8 in which said comparing means of said first stage are not the same components as said comparing means of said second stage, whereby analog-to-digital conversion can proceed in a pipeline of stages which do not re-use circuitry cyclically, whereby, for instance, a second first-stage unknown analog input signal could be compared and adjusted by said first stage while said second-stage unknown analog input signal is being compared by said second stage.

11. The machine of claim 1 further including means for pre-generating said first set of known analog reference signals and for pre-generating said second set of known analog reference signals.

12. The machine of claim 11 in which said means for pre-generating said first set of known analog reference signals and for pre-generating said second set of known analog reference signals comprises means for pre-generating one or more pairs of opposite-polarity signals, the polarity being with respect to a first zero reference.

13. The machine of claim 12 in which said means for pre-generating said first set of known analog reference signals comprises:
  a. a first reference voltage
  b. a second reference voltage which is said first zero reference
  c. a first op-amp having a first inverting input, a first non-inverting input, and a first output, with said first non-inverting input connected to said second reference voltage
  d. a first resistor string which is connected between said first reference voltage and said first inverting input of said first op-amp and which has at least two resistors
  e. a second op-amp having a second inverting input, a second non-inverting input, and a second output, said second op-amp being in a buffer configuration with said second non-inverting input connected to a first tap point between two resistors of said first resistor string and said second output connected to said second inverting input
  f. a second resistor string which is connected between said first inverting input and said first output, said second resistor string having at least one resistor whereby said first output has a value substantially equal to a first voltage between said first reference voltage and said second reference voltage, and whereby said second output has a value less than said second reference voltage if said first reference voltage is greater than said second reference voltage or greater than said second reference voltage if said first reference voltage is less than said second reference voltage, so that, for instance, generating one pair of opposite-polarity signals can be implemented using three resistors and two op-amps, rather than four resistors and two op-amps.

14. The machine of claim 11 in which members of said second set of known analog reference signals are binary-scaled members of said first set of known analog reference signals.

15. The machine of claim 14 in which members of said second set of known analog reference signals are pre-generated using members of said first set of known analog reference signals.

16. The machine of claim 11 in which a pre-generated member of said first set of pre-generated known reference signals is also a member of said second set of pre-generated known reference signals, whereby means for pre-generating said pre-generated member can be shared by said first stage and by said second stage, saving the resource cost of having entirely separate pre-generating means.

17. The machine of claim 1 in which said combining means comprises a resistive op-amp circuit.

18. The machine of claim 17 in which said resistive op-amp circuit consists of:
  a. a ground terminal
  b. an op-amp having a first inverting input, a first non-inverting input, and a first op-amp output, with said first non-inverting input connected to said ground terminal
  c. a first resistor having a first resistance value, said first resistor being connected between an input voltage source and said first inverting input, said input voltage source having a value substantially equal to said first unknown analog input signal d. a second number of resistors having said first resistance value, each of said second number of resistors being connected between said first inverting input and one of said second number of adjustment voltage sources each providing one of first-stage adjustment signals e. a feedback resistor having a second resistance value and being connected between said first output and said first inverting input whereby the value of the output signal of said first op-amp is substantially equal to the negative of the scaled sum of said first unknown analog input signal and said first-stage adjustment signals, with the scaling depending on the relative values of said first resistance value and said second resistance value.

19. The machine of claim 18 in which said first resistance value is the same as said second resistance value, whereby said negative scaling factor with respect to said first-stage unknown input signal is minus one.

20. The machine of claim 18 in which said second resistance value is substantially equal to two to a power M, where M is a positive integer, whereby said negative scaling factor with respect to said first-stage unknown input signal is minus two to said power M.

* * * * *